United States Patent [19]

Shibata et al.

[11] 4,140,547
[45] Feb. 20, 1979

[54] METHOD FOR MANUFACTURING MOSFET DEVICES BY ION-IMPLANTATION

[75] Inventors: Tadashi Shibata; Nozomu Harada, both of Yokohama, Japan

[73] Assignee: Tokyo Shibaura Electric Co., Ltd., Kawasaki, Japan

[21] Appl. No.: 831,393

[22] Filed: Sep. 8, 1977

[30] Foreign Application Priority Data

Sep. 9, 1976 [JP]  Japan .................. 51-107272
Mar. 17, 1977 [JP]  Japan .................. 52-28599

[51] Int. Cl.² .................. H01L 21/265; H01L 29/78
[52] U.S. Cl. .......................... 148/1.5; 357/23; 357/91
[58] Field of Search .............. 357/23, 91; 156/652, 156/653; 148/1.5

[56] References Cited

U.S. PATENT DOCUMENTS

| | | | |
|---|---|---|---|
| 3,479,237 | 11/1959 | Bergh et al. | 156/11 |
| 3,711,753 | 1/1973 | Brand et al. | 317/235 R |
| 3,756,861 | 9/1971 | Payne et al. | 148/1.5 |
| 3,764,423 | 10/1973 | Hauser et al. | 156/3 |
| 3,928,082 | 12/1975 | Schwettmann et al. | 148/1.5 |
| 3,959,025 | 5/1976 | Polinsky | 148/1.5 |
| 3,983,572 | 9/1976 | Johnson | 357/23 |
| 4,011,581 | 3/1977 | Kubo et al. | 357/52 |
| 4,012,762 | 3/1977 | Abe et al. | 357/52 |
| 4,016,007 | 4/1977 | Wada et al. | 148/1.5 |

OTHER PUBLICATIONS

Appels et al., "Local Oxidation of Si----", Philips Res. Rep. 25, 1970, 119.
Kobota et al., "A New N-Channel Si-Gate Technology...", IEDM, Wash., D.C., Tech. Digest 1975, p. 295.
Christie et al., "N-Channel MOSFET----", IEDM, Wash., D.C. Tech. Digest, 1973, p. 464.
Johnson, "Self-Alignment ----High Performance FETs", IBM-TDB, 15, (1972), 680.
Sato et al., "Study --In MAOS FET", Solid State Elec., 17, (1974), 367.
Dennard et al., "Min$^m$ Defect ----Enhancement/Depletion Process", IBM-TDB, 16, (1973), 1530.
Elizah et al., "Etching Technique for Min$^m$ Undercutting", IBM-TDB, 14, (1972), 2607.

Primary Examiner—L. Dewayne Rutledge
Assistant Examiner—Upendra Roy
Attorney, Agent, or Firm—Flynn & Frishauf

[57] ABSTRACT

A method for manufacturing an MOS FET includes a step of forming a $p^+$-type layer in a p-type substrate by injecting ions into the substrate through a field oxide film using a mask layer and removing the portion of the field oxide film under the mask layer.

14 Claims, 19 Drawing Figures

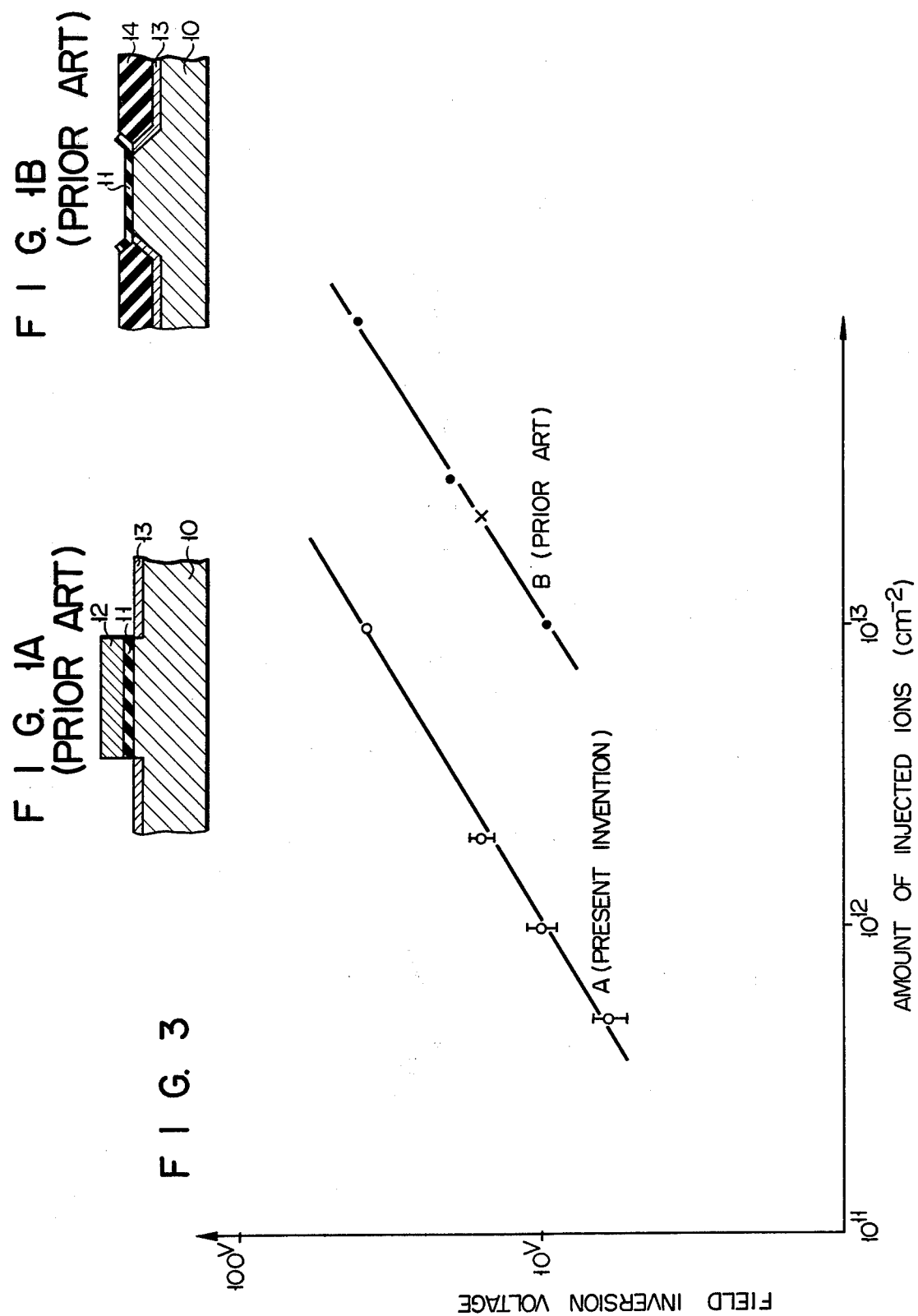

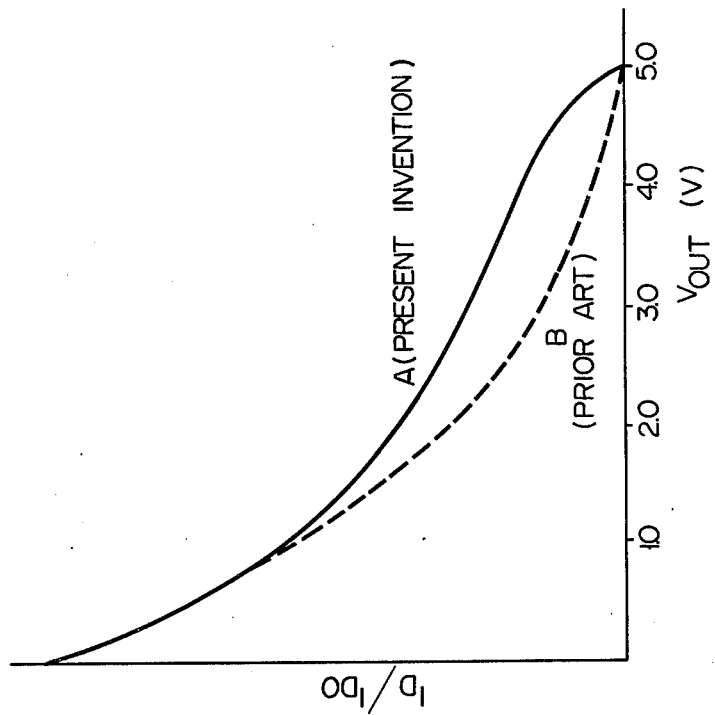
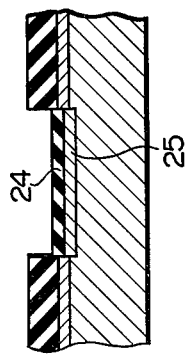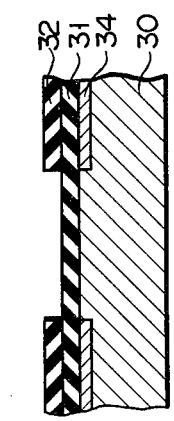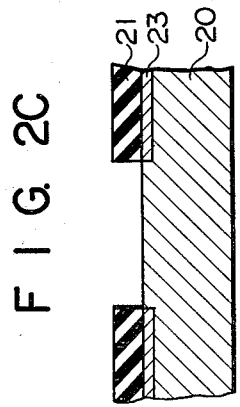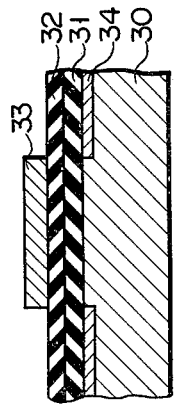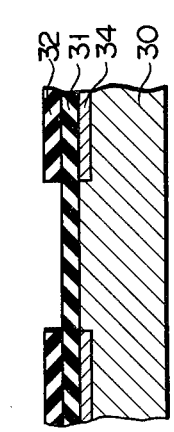

4,140,547

METHOD FOR MANUFACTURING MOSFET DEVICES BY ION-IMPLANTATION

BACKGROUND OF THE INVENTION

This invention relates to a method for manufacturing semiconductor devices each with an ion-implanted semiconductor substrate.

Hitherto, silicon oxide ($SiO_2$) films have been used to separate semiconductor elements formed in a semiconductor substrate in case the substrate is made of silicon. As well known, however, positive charges exist at the interface between the silicon substrate and an $SiO_2$ film. Due to the positive charge an inversion layer is formed in the substrate if the substrate is of p-type. This phenomenon is generally called "field inversion". Due to the field inversion a mutual electrical separation of the semiconductor elements becomes impossible.

To accomplish an effective separation among the semiconductor elements in a p-type substrate, it is therefore necessary not only to provide $SiO_2$ films but also to elevate the acceptor concentration of the silicon substrate right beneath the $SiO_2$ films to such extent that no inversion layer is formed in the substrate under each $SiO_2$ film. Further those portions of the silicon substrate which are to become semiconductor elements should have such a acceptor concentration that inversion layers or channels can be formed by applying a suitable voltage to electrodes formed on said portions of the substrate through insulation films made of, for example, $SiO_2$. This control of impurity concentration is carried out by ion injection technique.

There is known a method which meets the above-noted requirements and which can achieve a self alignment between a field oxide film and portions of a substrate with a high impurity concentration. Owing to the self alignment between a field oxide film and the portions having a high impurity concentration, the semiconductor chip need not have an excessive surface area to permit an erroneous masking. For this reason the known method manufactures semiconductor devices which can be made into highly integral IC's.

With reference to the accompanying FIGS. 1A and 1B it will be explained how to manufacture semiconductor devices in the above-mentioned known method. First, an $Si_3N_4$ film 11 is deposited on a p-type silicon substrate 10. A photoresist 12 is then coated on that portion of the $Si_3N_4$ film 11 under which a semiconductor element is to be formed. Using the photoresist 12 as a mask, the remaining portion of the $Si_3N_4$ film 11 is etched to expose the upper surface of the substrate 10. This done, using the photoresist 12 as a mask again, boron ions are injected into the substrate 10, thereby forming a high impurity concentration layer 13 as shown in FIG. 1A. The layer 13 serves to prevent an inversion layer from being formed. Thereafter the photoresist 12 is removed from the surface of the $Si_3N_4$ film 11. Using the $Si_3N_4$ film 11 as a mask, the field region of the substrate 10, i.e. portion on which the high impurity concentration layer 13 is formed, is heated to form such a field oxide film 14 as shown in FIG. 1B.

As shown in FIG. 1B, however, the field silicon oxide film 14 also grows to the portion under the $Si_3N_4$ film 11. As a result, the surface area of that portion of the substrate 10 which is to become a semiconductor element is made smaller than that defined by the photoresist 12. To control the ratio between the actual surface area and the surface area defined by the photoresist 12 is extremely difficult. A semiconductor element cannot therefore be made with a sufficient dimensional precision. In particular, it is difficult to form a small-sized element with a high dimensional precision. In view of this the known method is defective.

Further, a great stress concentrates on the edge of the field oxide film 14 when the film 14 is being formed. As a result, the silicon crystals in that portion of the substrate 10 which is to become a semiconductor element are mostly rendered defective. This would deteriorate the electrical characteristics of the resultant semiconductor element.

Moreover, since the field region of the substrate 10 is heated at a high temperature, i.e. 1,000° C. for six to seven hours to form a field oxide film 14, the impurities in the high impurity concentration layer of the field region diffuse into that portion of the substrate 10 which is to become a semiconductor element. Consequently the electrical characteristics and operational speed of the resultant semiconductor element are deteriorated and lowered. The smaller is the semiconductor element, the more will be lowered its electrical characteristics and operational speed. In addition, the known method is rather complicated since it includes cumbersome steps such as deposition of an $Si_3N_4$ film and etching process.

SUMMARY OF THE INVENTION

Accordingly, the object of this invention is to provide a method for manufacturing semiconductor devices, which employs self alignment techniques to minimize easily the elements in each semiconductor device and thus make the devices into IC's without deteriorating the electrical characteristics of the elements.

BRIEF DESCRIPTION OF THE DRAWING

FIGS. 1A and 1B show the steps of a typical prior art method for manufacturing semiconductor devices;

FIGS. 2A to 2D show the steps of the method for manufacturing semiconductor devices according to one embodiment of this invention;

FIGS. 3 and 4 are graphs showing the electrical characteristics of the semiconductor devices obtained by the method of FIGS. 2A to 2D in comparison with the electrical characteristics of the semiconductor devices manufactured by the prior art method;

FIGS. 5A to 5C show the steps of another embodiment of this invention; and

DETAILED DESCRIPTION OF THE PREFERRED EMBODIMENTS

Figure 6A:
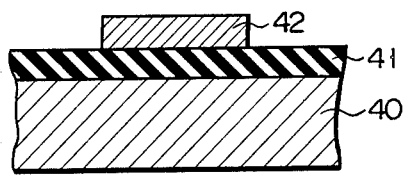
FIGS. 6A to 6E and 7A to 7C respectively show the steps of different further embodiments of this invention.

With reference to FIGS. 2A to 2D, the method for manufacturing semiconductor devices according to an embodiment of this invention.

First, on a p-type silicon substrate 20 having an impurity concentration of about $7 \times 10^{14}$ cm$^{-3}$ a field silicon oxide film 21 is formed to have a thickness of about 6,000 to 7,000Å. That portion of the substrate 20 which is to become a semiconductor element is then coated with an negative type photoresist 22 about 1.0 to 1.5 microns thick, as shown in FIG. 2A. The photoresist 22 may be a mixture of a sensitizer and polyisoprene resin (e.g. OMR83 (trademark) by Tokyo Ohka K.K.) or a mixture of a sensitizer and a cinnamic acid polymer. The substrate 20 with the field oxide film 21 and the photoresist 22 is placed in Freon plasma for one to two minutes, thereby passivating the surface of the field oxide film 21. This done, using the photoresist 22 as a mask, boron ions are injected selectively into the substrate 20 through the field oxide film 21, thereby forming a p$^+$-type layer 23 which has an impurity concentration of about $1\times10^{16}$ cm$^{-3}$ and which serves to prevent an inversion layer from being formed. This boron ion injection can be achieved by applying 200 to 300KV (, for example 300KV) and injecting boron ions at the rate of $1\times10^{12}$ to $10^{13}$ cm$^{-2}$ (, for example $1\times10^{13}$ cm$^{-2}$).

Thereafter, the substrate 20 is made to stand in HF gas for a predetermined time, thereby etching away that portion of the field oxide film 21 which is right beneath the photoresist 22. Then the photoresist 22 is removed from the surface of the substrate 20 as shown in FIG. 2C, thus exposing that portion of the substrate 20 which is to become a semiconductor element. The etching process is carried out at 160° C. under HF gas pressure of 15 Torr. In case the field oxide film 21 has been formed by the chemical vapor deposition (CVD) method, the film 21 is etched at the rate of 1,500Å per minute. If the film 21 has been made by the thermal oxidization method, it is etched at the rate of 1,400Å per minute. Based on the etching rate the etching time is determined.

Then, the exposed surface of the substrate 20 is heated and thus oxidized, thereby forming a silicon oxide film 24 about 1,000Å thick on the exposed surface of the substrate 20. Through the film 24 phosphorous ions are injected into the substrate 20 at the rate of 2 to $3\times10^{11}$ cm$^{-2}$ by applying an acceleration voltage of about 140Kev. As a result, an n$^-$-type layer (or an action layer) 25 is formed right beneath the silicon oxide film 24. The properties of the n$^-$-type layer 25 are so controlled that an MOS transistor to be formed in the layer 25 may have a proper threshold voltage of, for instance, $-2$ to $-3$V.

Finally, the silicon oxide film 24 is partially removed in the known manner. Phosphorus is then diffused deeper into the substrate 20, thereby forming n$^+$-type source and drain regions. A gate electrode is then formed on the remaining silicon oxide film 24 by aluminum deposition and source and drain electrodes are formed in the source and drain regions, respectively, by selective etching and aluminum deposition. In this way a depletion type MOS FET is formed.

By the above-mentioned method semiconductor devices were made. These semiconductor devices were found to have an average field inversion voltage of about 38V.

The field inversion voltage of the semiconductor device changes according to the amount of the boron injected to form the high impurity concentration layer 23 which prevents an inversion layer from being formed. In FIG. 3, line A shows the relationship between the field inversion voltage and amount of injected boron of the semiconductor devices manufactured by the above-mentioned method of this invention, and line B the voltage-boron amount relationship in the semiconductor devices made by the prior art method shown in FIGS. 1A and 1B. In FIG. 3 the field inversion voltage is plotted on ordinate, and the amount of injected boron on abscissa. In both methods, each silicon substrate was heated in wet oxygen gas at 1,000° C., thereby forming a field oxide film 7,000Å thick. In the method of this invention an acceleration voltage of 300KeV was applied to inject boron ions into the substrate, and in the prior art method an acceleration voltage of 120KeV was applied for the same purpose.

FIG. 3 shows that the devices made by the method of this invention have a field inversion voltage about four to five times as high as possess the devices manufactured by the prior art method of FIGS. 1A and 1B in case the same amount of boron has been injected into the substrate in both methods. This is because in the method of FIGS. 2A to 2D boron ions are injected after a field oxide film has been formed, and the injected boron has no chance to diffuse into the field oxide film thereby to lower the impurity concentration of the high impurity layer.

In FIG. 4, line A shows the load characteristics of the depletion type MOS FET's with a channel width of 4 microns, manufactured by the method of this invention, and line B the load characteristics of the depletion type MOS FET's with a channel width of 4 microns, obtained by the prior art method of FIGS. 1A and 1B.

When lines A and B in FIG. 4 are compared, it will be understood that more current flows in the MOS FET made by the method of this invention than in the MOS FET manufactured by the prior art method in case both MOS FET's obtain the same output voltage $V_{out}$. In addition, as lines A and B suggest, the MOS FET made by the method of this invention operates more quickly by about 30% than the MOS FET made by the prior art method if it is employed as an inverter. Further, since no stress concentrates on the edge of the field oxide film, the silicon crystals in the substrate of the MOS FET made by the method of this invention are hardly rendered defective. Thus, the electrical characteristics of the MOS FET will not be deteriorated.

As mentioned before and as shown in FIG. 2D, in the method of this invention phosphorus ions are injected through a gate silicon oxide film in such an amount as would control the threshold voltage of an MOS FET to be formed. For this reason, the field inversion voltage and threshold voltage of the MOS FET can be determined independently. For the same reason, the MOS FET's formed in the same substrate have among them little difference in threshold voltage. In addition, a little boron, if any, oozes into the field portion of each element. For this reason, the semiconductor element has an improved speed-power product. For example, an MOS FET having a channel width of 4 microns and a field inversion voltage of 15V has its speed-power product enhanced by about 30% over the MOS FET of the same dimensions manufactured by the prior art method.

Now, with reference to FIGS. 5A to 5C another method according to this invention will be described.

First, on a silicon substrate 30 an alumina (Al$_2$O$_3$) layer 31 is formed to have a thickness of 3,000Å. Then an SiO$_2$ layer 32 also 3,000Å is deposited on the alumina layer 31 by the CVD method. Thereafter a negative type photoresist 33 is coated on that portion of the SiO$_2$ layer 32 under which a semiconductor element is to be formed. Using the photoresist 33 as a mask, boron ions are injected into the substrate 30 through the SiO$_2$ layer 32, thereby forming such a p-type high impurity concentration layer 34 as shown in FIG. 5A. The high impurity concentration layer 34 serves to prevent an inversion layer from being formed.

Then, the substrate 30 is placed in HF gas, thereby etching away that portion of the SiO$_2$ layer 32 which is right beneath the photoresist 33. This done, the photoresist 33 is removed in the known manner, as shown in FIG. 5B. Using the remaining SiO$_2$ layer 32 as a mask, the alumina layer 31 is selectively etched, thereby exposing that portion of the substrate 30 in which a semiconductor element is to be formed. Thereafter, a gate silicon oxide film, an operating layer, source and drain regions and necessary electrodes are formed in such a manner as in the method of FIGS. 2A to 2D, thereby forming an MOS LSI.

In the above-mentioned two methods of this invention, a field oxide film is partially etched by using a combination of HF gas and a negative type photoresist as a mask. Instead, a phosphorus-doped $SiO_2$ film may be used as a field oxide film, and $CHF_3$ may be employed as etching gas. In this case, $CHF_3$ gas penetrates a negative type photoresist and can thus etches away that portion of the phosphorus-doped $SiO_2$ film which is right beneath the photoresist. Further, the etching process need not be limited to one wherein an etching fluid penetrates a photoresist. Any other etching process may be employed if it can etch with a high precision that portion of an insulative film which is right beneath the mask used in injecting boron ions. Two methods including such an etching process will be described with reference to FIGS. 6A to 6E and FIGS. 7A to 7C.

Figure 6B:
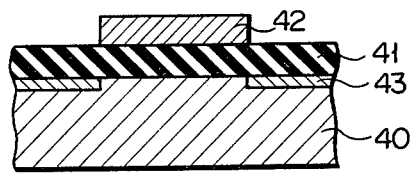
Figure 6C:
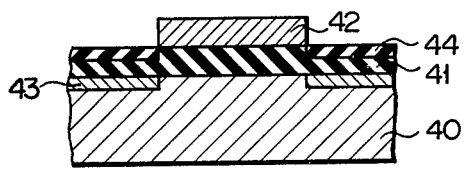

In the method of FIGS. 6A to 6E, an $SiO_2$ film 41 about 6,000 to 7,000Å thick is formed on a p-type silicon substrate 40. Then a mask layer 42, for example, a photoresist 1.0 to 1.5 microns thick, is formed on that portion of the substrate 40 in which a semiconductor element is to be formed, as shown in FIG. 6A. Using the mask layer 42, boron ions are injected into the substrate 40 through the $SiO_2$ film 41, thereby forming a high impurity concentration layer 43 as shown in FIG. 6B. The layer 43 thus formed serves to prevent an inversion layer from being formed. This done, using the mask layer 42 for the second time, nitrogen ions are injected into the $SiO_2$ film 41 in an amount of $10^{16}$ to $10^{17}$ cm$^{-2}$ by applying an acceleration voltage of 30 to 50KV. As a result, a high impurity concentration layer 44 containing nitrogen ions is formed on the $SiO_2$ film 41 as shown in FIG. 6C. The layer 44 may be formed in other places or as thick as the $SiO_2$ film 41. This is possible if the amount of nitrogen to be injected and the acceleration voltage are selected to be suitable values.

Figure 6D:
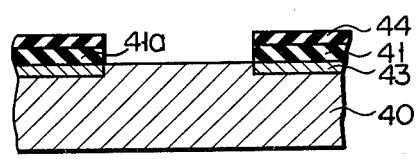

Thereafter, the mask layer 42 is removed. The substrate 40 is then heated at 1,000° C. in oxygen gas for 20 to 30 minutes, thereby turning the nitrogen-doped layer 44 into a silicon oxynitride layer. Since the silicon oxynitride layer 44 is etched more slowly than an $SiO_2$ film in an etchant such as $NH_4F$, it can be utilized as a mask in etching the $SiO_2$ film 41. Thus, using the silicon oxynitride layer 44 as a mask, that portion of the $SiO_2$ film 41 under which a semiconductor element is to be formed is etched away as shown in FIG. 6D. As a result, the substrate 40 is partially exposed through an opening 41a. More precisely, the $SiO_2$ film 41 is kept immersed in $NH_4F$ solution for 8 to 10 minutes, and its portion which is not covered with the silicon oxynitride layer 44 is removed selectively. Consequently, the opening 41a and the edge of the high impurity concentration layer 43 are automatically aligned with each other.

Figure 6E:
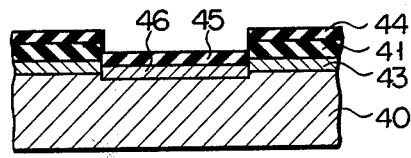

Then, a gate oxide film 45 and an operating layer 46 by diffusing impurities into the substrate 40 as shown in FIG. 6E in such a manner as shown in FIG. 2D. A source region and a drain region are then formed in the known method, thereby forming an MOS FET.

Figure 7A:
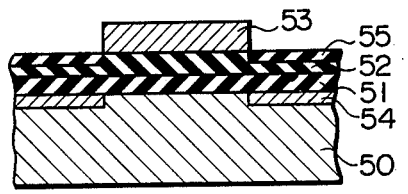
Figure 7B:
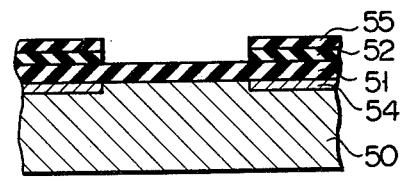
Figure 7C:
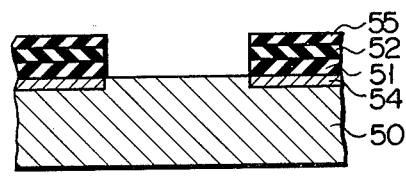

In the method of FIGS. 7A to 7C, an alumina ($Al_2O_3$) layer 51 is formed on p-type silicon substrate 50. On the alumina layer 51 an $SiO_2$ layer 52 is deposited, thereby forming a double-layer field oxide film. A photoresist mask 53 is formed on that portion of the field oxide film under which a semiconductor element is to be formed. Using the mask 53, boron ions are injected into the substrate 50, thereby forming a $p^+$-type high impurity concentration layer 54 in the substrate 50. The high impurity concentration layer 54 serves to prevent an inversion layer from being formed. Then, using the mask 53 again, nitrogen ions are injected into the field oxide film. The photoresist mask 53 is removed from the surface of the field oxide film, using a photoresist-removing agent. This done, the nitrogen-doped field oxide film is oxidized, thereby forming a silicon oxynitride layer 55 in the field oxide film as shown in FIG. 7A.

Then, that portion of the field oxide film under which a semiconductor element is to be formed is etched away by $NH_4F$ solution, thus exposing a part of the alumina layer 51 as illustrated in FIG. 7B. Then, using the remaining portion of the field oxide film as a mask, the exposed part of the alumina layer 51 is etched away, thus forming an opening, thereby exposing the portion of the substrate where a semiconductor element is to be formed, as shown in FIG. 7C. The opening formed in the field insulating film is aligned automatically with the edge of the high impurity concentration layer 54. This done, a gate oxide film, an operating layer, and source and drain regions are formed in such a manner as shown in FIG. 2D.

In the last two methods according to this invention, a silicon oxynitride layer and $NH_4F$ solution cooperate to etch selectively that portion of a field oxide film under which a semiconductor element is to be formed. But the etchant is not limited to $NH_4F$ solution. Nor is the layer which is etched by the etchant more slowly than the field oxide film limited to silicon oxynitride layer.

In all the above-described methods according to this invention, a p-type silicon substrate is used. Instead, an n-type silicon substrate may be used in the method of this invention. Further, instead of silicon any other semiconductor material may be used to form a substrate. Still further, the ions to be injected and the material of the field oxide film need not be limited to those employed in the above-mentioned examples of this invention.

What we claim is:

1. A method for manufacturing semiconductor devices, comprising steps of:
   forming on a semiconductor substrate an insulative layer including first and second portions which are contacted with each other, the first portion being enclosed by the second portion;
   disposing a mask layer to cover up the first portion of said insulative layer;
   injecting impurity ions into a part of said semiconductor substrate through the second portion of said insulative layer to form a field layer right beneath the second portion of said insulative layer, the field layer having a higher impurity concentration than, and the same conductivity type, as said part of said semiconductor substrate;
   etching away the first portion of said insulative layer, thereby forming an opening enclosed by the second portion in said insulative layer; and
   introducing impurities into said semiconductor substrate through the opening to define an active element in said semiconductor substrate which contacts the field layer.

2. A method according to claim 1, wherein said etching step includes removing the first portion of said insulative layer which is right beneath said mask layer; and thereafter removing said mask layer thereafter.

3. A method according to claim 1, wherein said etching step includes forming an etching-resist layer in the second portion of said insulative layer using said mask layer; removing said mask layer, and removing the first portion of said insulative layer using said etching-resist layer as a mask.

4. A method according to claim 1, comprising injecting said impurity ions into a part of said semiconductor substrate under an acceleration voltage of about 300 KeV.

5. A method according to claim 2, wherein said step of forming the insulative layer includes forming a silicon oxide layer directly on said semiconductor substrate; said step of disposing the mask layer includes forming a negative type photoresist mask directly on the silicon oxide layer; and said etching step includes etching that portion of the silicon oxide layer which is right beneath the mask by an etching gas passing through the photoresist mask.

6. A method according to claim 2, wherein said insulative layer includes at least two films and said step of forming the insulative layer includes forming a first insulative film on the substrate and forming a second insulative film of silicon oxide on the first insulative film; said step of forming the mask layer includes forming a negative type photoresist mask directly on the second insulative film; and said etching step includes removing that portion of the second insulative film which is right beneath said mask layer, using an etching gas passing through said mask layer, removing said mask layer, and removing a part of the first insulative film by using the remaining portion of the second insulative film as a mask.

7. A method according to claim 3, wherein said step of forming the etching-resist layer includes injecting ions into the second portion of said insulative layer; and applying a heat treatment to the ion injected portion of said second portion.

8. A method according to claim 5, wherein said etching gas is hydrogen fluoride.

9. A method according to claim 6, wherein said etching gas is hydrogen fluoride gas.

10. A method according to claim 9, wherein said first insulative film is an alumina film.

11. A method according to claim 7, wherein said step of forming the insulative layer includes forming a silicon oxide layer directly on said semiconductor substrate; said step of injecting ions includes injecting boron ions into the second portion of said insulative layer; and said step of applying a heat treatment forms a silicon oxynitride layer.

12. A method according to claim 7, wherein said insulative layer includes at least two films and said step of forming the insulative layer includes forming a first insulative film directly on said substrate and forming a second insulative layer of silicon oxide on the first insulative film; injecting boron ions into the second insulative film during said step of injection of ions; forming a silicon oxynitride layer in the first insulative film during said heat treatment; and said etching step includes selectively removing the second insulative film, using the silicon oxynitride layer as a mask and selectively removing the first insulative film, using the remaining portion of the second insulative film as a mask.

13. A method according to claim 11, comprising injecting said boron ions under an acceleration voltage of about 300 KeV.

14. A method according to claim 12, comprising injecting said boron ions under an acceleration voltage of about 300 KeV.

* * * * *